United States Patent
Tso et al.

(10) Patent No.: US 8,786,641 B2
(45) Date of Patent: Jul. 22, 2014

(54) DIGITAL-TO-ANALOG CONVERTER AND METHOD THEREOF

(75) Inventors: Ko-Yang Tso, Jhonghe (TW); Hui-Wen Miao, Hsinchu (TW); Chin-Chieh Chao, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 1656 days.

(21) Appl. No.: 12/078,993

(22) Filed: Apr. 9, 2008

(65) Prior Publication Data

US 2008/0252667 A1    Oct. 16, 2008

(30) Foreign Application Priority Data

Apr. 10, 2007   (TW) .............................. 96112600 A

(51) Int. Cl.
*G09G 5/10* (2006.01)
(52) U.S. Cl.
USPC ................ 345/690; 345/100; 345/98; 345/55
(58) Field of Classification Search
USPC ............................................ 345/690, 55, 98
See application file for complete search history.

(56) References Cited

U.S. PATENT DOCUMENTS

| | | | | |
|---|---|---|---|---|
| 7,236,114 B2* | 6/2007 | Ahn | ............................ | 341/144 |
| 2006/0125761 A1* | 6/2006 | Ahn | ............................ | 345/98 |
| 2007/0194965 A1* | 8/2007 | Kim et al. | ............................ | 341/144 |
| 2007/0216633 A1* | 9/2007 | Kim | ............................ | 345/100 |

* cited by examiner

*Primary Examiner* — William Boddie
*Assistant Examiner* — Leonid Shapiro

(57) ABSTRACT

A digital-to-analog (D/A) converter comprises a decoder apparatus and an operational amplifier. The decoder apparatus comprises first and second decoder unit. The first decoder unit selects a voltage of first voltage set as first and second voltage in response to a value of first gray level set. The second decoder unit selects first border voltage of second voltage set as the first and the second voltages and second border voltage of that as the first and the second voltages in response to the maximum and the minimum value of second gray level set respectively. The second decoder unit further selects the first and the second boarder voltage as the first and the second voltage respectively in response to an intermediate value of the second gray level set. The operational amplifier generates a pixel voltage having level between the first and the second voltage accordingly.

10 Claims, 10 Drawing Sheets

| Bit \ Gray level | DT7 | DT6 | DT5 | DT4 | DT3 | DT2 | DT1 | DT0 | A | B | C | D | E | O1 | O2 |
|---|---|---|---|---|---|---|---|---|---|---|---|---|---|---|---|
| 0~31 | 0 | 0 | 0 | DT4-DT0 | | | | | | | | L0~L31 | | D | D |
| 32 | 0 | 0 | 1 | 0 | 0 | 0 | 0 | 0 | L32 | L34 | DC | | | A | A |
| 33 | 0 | 0 | 1 | 0 | 0 | 0 | 0 | 1 | L32 | L34 | DC | | | A | A |
| 34 | 0 | 0 | 1 | 0 | 0 | 0 | 1 | 0 | L32 | L34 | DC | | | A | B |
| 35 | 0 | 0 | 1 | 0 | 0 | 0 | 1 | 1 | L34 | L34 | DC | | | B | B |
| 36 | 0 | 0 | 1 | 0 | 0 | 1 | 0 | 0 | L36 | L38 | DC | | | A | B |
| 37 | 0 | 0 | 1 | 0 | 0 | 1 | 0 | 1 | L36 | L38 | DC | | | A | A |
| 38 | 0 | 0 | 1 | 0 | 0 | 1 | 1 | 0 | L36 | L38 | DC | | | A | B |
| 39 | 0 | 0 | 1 | 0 | 0 | 1 | 1 | 1 | L36 | L38 | DC | | | B | B |
| 40 | 0 | 0 | 1 | 0 | 1 | 0 | 0 | 0 | L40 | L42 | L40 | | | A | A |
| ... | | | | | | | | | | | | | | | |
| 223 | 1 | 1 | 0 | 1 | 1 | 1 | 1 | 1 | L220 | L222 | L224 | | | C | B |
| 224-255 | 1 | 1 | 1 | DT4-DT0 | | | | | | | | | L224-L255 | E | E |

DIGITAL-TO-ANALOG CONVERTER AND METHOD THEREOF

This application claims the benefit of Taiwan application Serial No. 096112600, filed Apr. 10, 2007, the subject matter of which is incorporated herein by reference.

BACKGROUND OF THE INVENTION

1. Field of the Invention

The invention relates in general to a digital-to-analog (D/A) converter, and more particularly to a digital-to-analog converter capable of obtaining an analog value corresponding to a part of numeric range of a digital value by way of interpolation.

2. Description of the Related Art

Liquid crystal display has been widely used in the display of various electronic products including TV, computer monitor, notebook computer, mobile phone and digital personal assistant. The data driver of liquid crystal display comprises a digital-to-analog (D/A) converter and a scan driver, wherein the D/A converter provides a pixel voltage to the liquid crystal display according to the gray level, and the scan driver scans the pixel voltage to each pixel of the liquid crystal display for displaying the desired image.

As the relationship between the pixel voltage and the corresponding gray level is non-linear, the conventional D/A converter converts the gray level into a pixel voltage by a Gamma voltage resistor string, and then inputs the pixel voltage to a liquid crystal display. However, as consumers are expecting higher display quality of liquid crystal display, the gray level has more bits and the grade of Gamma voltage resistor string also increases. Thus, the D/A converter will have large area circuit, hence incurring high cost. The conventional method of performing interpolation of each digital code to reduce the cost of the D/A converter is disadvantaged by higher error in pixel voltage and low display quality of liquid crystal display.

SUMMARY OF THE INVENTION

The invention is directed to a digital-to-analog (D/A) converter and a method thereof capable of resolving the shortcomings of conventional technologies including larger circuit area, higher cost, and larger error in pixel voltage caused by interpolation of digital code, and achieving the advantages of smaller area, lower cost, smaller error in pixel voltage, and better display quality of liquid crystal display using the same.

According to a first aspect of the present invention, a D/A converter for generating a number of corresponding voltages in response to a number of values of a gray level is provided. The digital-to-analog converter includes a decoder apparatus and an operational amplifier. The decoder apparatus includes first and second decoder units. The first decoder unit finds a corresponding voltage of a first voltage set and outputs the corresponding voltage as a first voltage and a second voltage in response to a corresponding value of a first value set of the gray level. The second decoder unit selects a first border voltage as the first and the second voltage in response to a maximum value of at least a second value set of the gray level, selects a second border voltage as the first and the second voltage in response to a minimum value of the at least a second value set, and selects the first and the second border voltage respectively as the first and the second voltage in response to at least an intermediate value of the at least a second value set. The operational amplifier generates a pixel voltage whose level ranges between the first and the second voltage accordingly.

According to a second aspect of the present invention, a digital-to-analog converting method used in the source driver for generating corresponding voltages in response to the values of a gray level is provided. The digital-to-analog converting method comprises the following steps. Firstly, a corresponding voltage of a first voltage set is selected as the first and the second voltage in response to a corresponding value of a first value set of the gray level. Next, first border voltage is selected as the first and the second voltage in response to the maximum value of the second value set of the gray level. Then, second border voltage is selected as the first and the second voltage in response to the minimum value of the second value set. Next, the first and the second border voltage are respectively selected as the first and the second voltage in response to intermediate value of the second value set of the gray level. Afterwards, an output voltage whose level ranges between the first and the second voltages is obtained by way of interpolation.

The invention will become apparent from the following detailed description of the preferred but non-limiting embodiments. The following description is made with reference to the accompanying drawings.

BRIEF DESCRIPTION OF THE DRAWINGS

FIG. 4 is a logic operation reference table of a decoder apparatus 21 of FIG. 1;

DETAILED DESCRIPTION OF THE INVENTION

Figure 1:
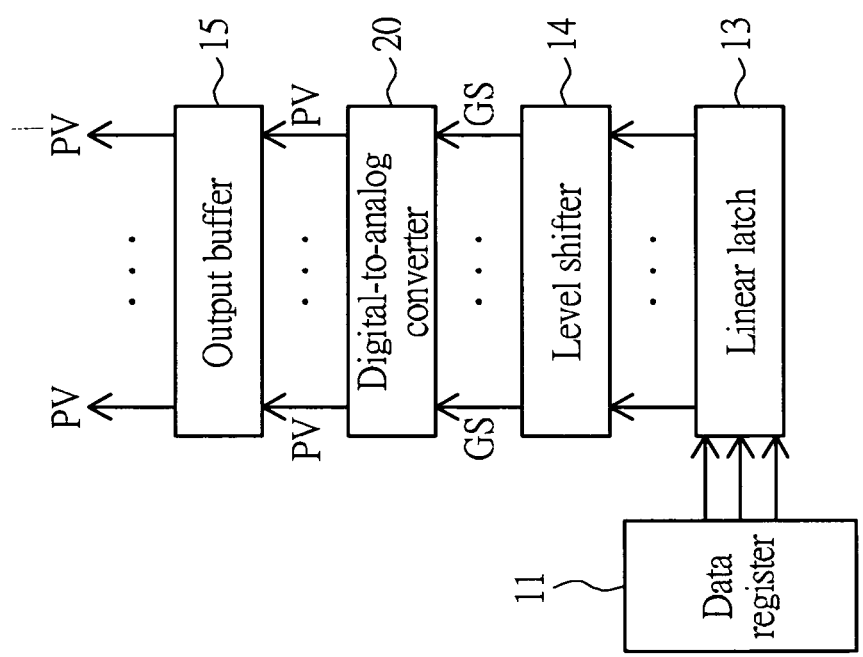
FIG. 1 is a block diagram of a digital-to-analog converter according to a preferred embodiment of the invention.
Figure 2:
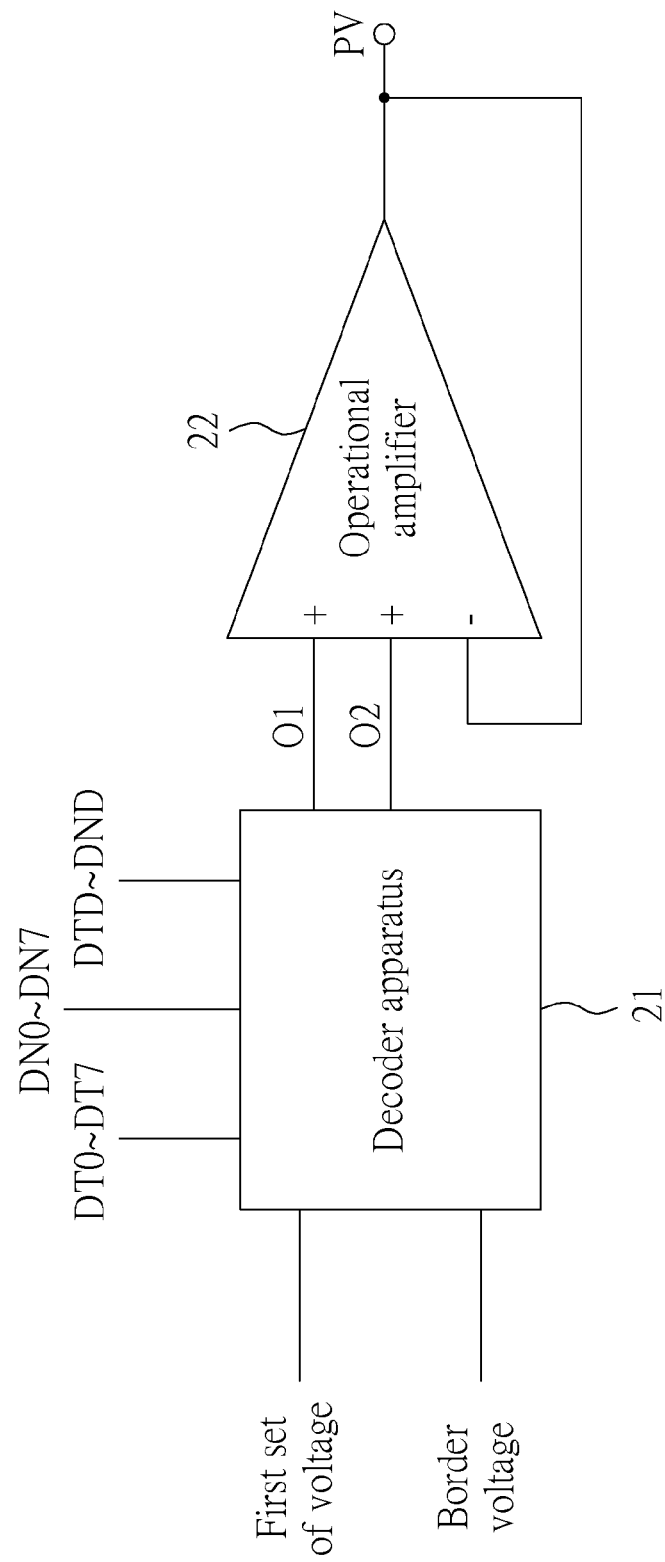
FIG. 2 is a block diagram of a data driver using the digital-to-analog converter of the invention.

Referring to FIG. 1 and FIG. 2. FIG. 1 is a block diagram of a digital-to-analog converter according to a preferred embodiment of the invention. FIG. 2 is a block diagram of a data driver using the digital-to-analog converter of the invention. The digital-to-analog (D/A) converter 20 is used in a data driver 10 for converting a gray level GS processed by a part of the hardware (such as the data register 11, the linear latch 13 and the level shifter 14) of the data driver 10 into a corresponding pixel voltage PV, and then the pixel voltage PV is outputted to the liquid crystal display (not illustrated) by the output buffer 15.

The D/A converter 20 comprises a decoder apparatus 21 and an operational amplifier 22. The decoder apparatus 21 is for receiving a first voltage set, a first and a second border voltage and a gray level GS. In the present embodiment of the invention, the gray level GS comprises 8-bit digital data DT0~DT7. The decoder apparatus 21 comprises a first decoder unit and a second decoder unit, wherein the first decoder unit selects the first voltage set as the voltages O1 and O2 in response to a first value set of the gray level GS.

The second decoder unit selects the first border voltage as the voltages O1 and O2 in response to the minimum value of the second value set of the gray level GS and selects the second border voltage as voltage O1 and O2 in response to the maximum value of the second value set of the gray level GS, and respectively selects the first and the second border voltages as one of the voltages O1 and O2 and the other of the voltages O1 and O2 in response to the intermediate values of the second value set.

The operational amplifier 22 generates a pixel voltage PV whose level ranges between the voltage O1 and the voltage O2 according to the voltages O1 and O2. For example, in the present embodiment of the invention, the operational amplifier 22 generates the pixel voltage PV by way of nearest neighbor interpolation, wherein the interpolation is substantially equal to the average of the voltages O1 and O2.

Thus, the D/A converter 20 can divide the values of the gray level GS into a first value set and a second value set. When the gray level GS is equal to the first value set, the voltage O1 and the voltage O2 are substantially equal; meanwhile the D/A converter 20 is substantially not performing interpolation. When the gray level GS is equal to the intermediate values of the second value set, the first and the second border voltages are respectively selected as one of the voltages O1 and O2 and the other of the voltages O1 and O2; meanwhile, the D/A converter 20 generates the pixel voltage PV by way of interpolation. Therefore, the D/A converter 20 obtains the pixel voltages mapped by the linear part and the non-linear part of the Gamma curve of gray level GS vs. pixel voltage PV respectively by way of interpolation and conventional resistance division. Hence, the D/A converter 20 improves the shortcomings of having larger converter area, higher cost and larger error in pixel voltage encountered in conventional technologies.

Figure 3:
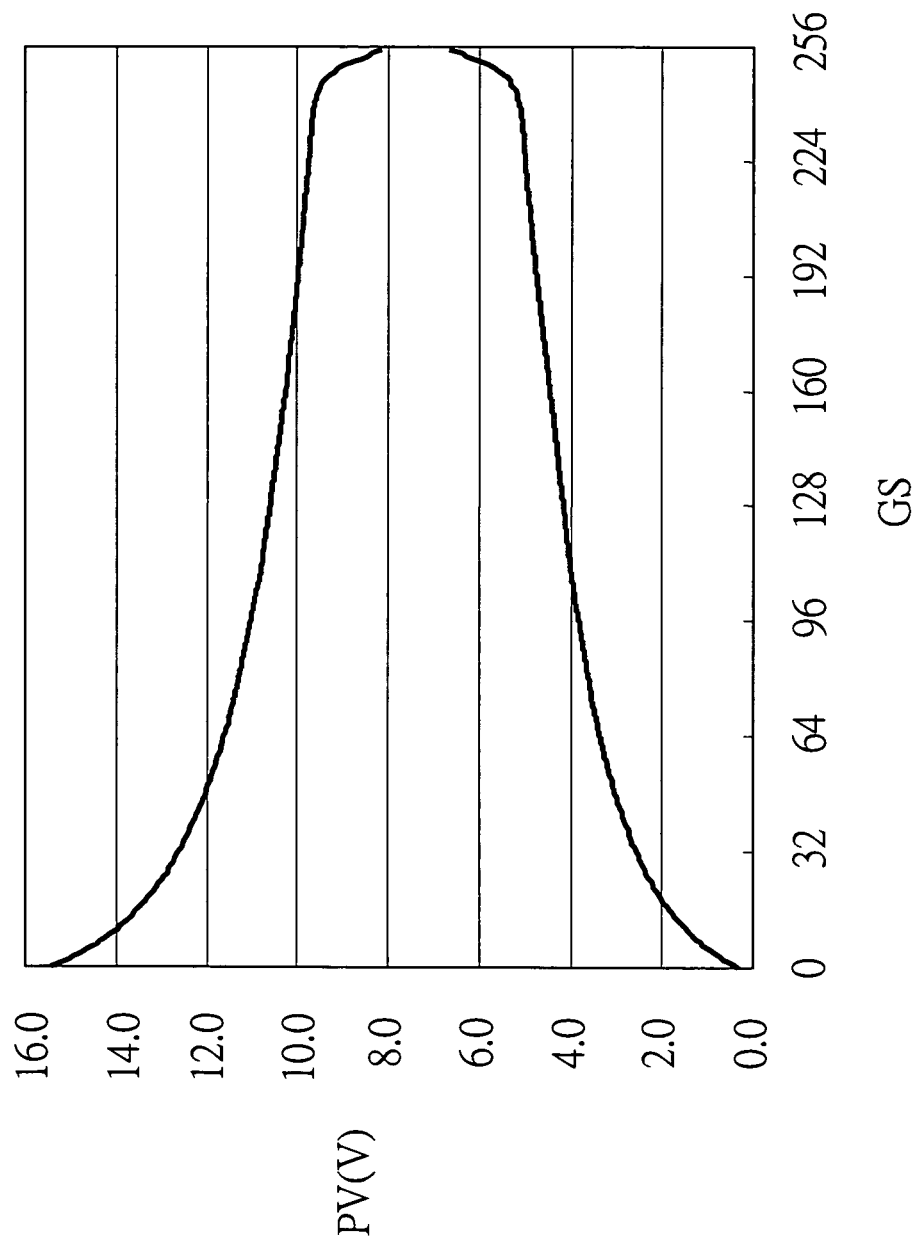
FIG. 3 is a Gamma curve of gray level GS vs. pixel voltage PV according to a preferred embodiment of the invention.

Referring to FIG. 3, a Gamma curve of gray level GS vs. pixel voltage PV according to a preferred embodiment of the invention is shown. The Gamma curve is substantially linear in the ranges that gray level GS is between 32~224, and is non-linear in the ranges that the gray level GS is smaller than 32 and greater than 224. Thus, the first value set of the gray level GS comprises 0~31 and 224~255, and the corresponding first voltage set comprises voltages L0~L31 and L224~L255. In the present embodiment of the invention, the gray level GS comprises 96 second value sets 32~34, 34~36, 36~38, . . . , and 222~224. The intermediate values are the intermediate values within each of the second value sets, that is, the odd values 33, 35, 37, . . . , and 223 in the corresponding second value sets. The first and second border voltages corresponding to the second value sets are respectively the voltages L32 and L34, L34 and L36, L36 and L38, . . . L222 and L224.

When the gray level GS is equal to 0~31 and 224~255, the first decoder unit selects and outputs one of the corresponding voltages L0~L31 and L224~L255 as the voltages O1 and O2. When the gray level GS is equal to the maximum value and the minimum value of the second voltage sets, that is, one of the values 32, 34, 36, 38, . . . , and 224, the second decoder unit respectively provides the corresponding voltage L32, L34, L36, L38, . . . , and L224 as the voltages O1 and O2. When the gray level is equal to the intermediate values of the second voltage sets, that is one of the values 33, 35, 37, . . . , and 223, the second decoder unit can respectively provide corresponding first and the second border voltages L32 and L34, L34 and L36, L36 and L38, . . . , and L222 and L224 as one of the voltages O1 and O2 and the other of the voltages O1 and O2.

In the present embodiment, the decoder apparatus 21 receives and operates according to the bit data DT0~DT7, DN0~DN7, the voltage L0~L31, L32, L34, L36, L38, . . . , and L222 and L224~L255. The bit data DN0—DN7 are respectively the inverse signals of the bit data DT0~DT7. The embodied circuit structure of the first and the second decoder unit of the decoder apparatus 21 are elaborated below by examples.

Figure 5:
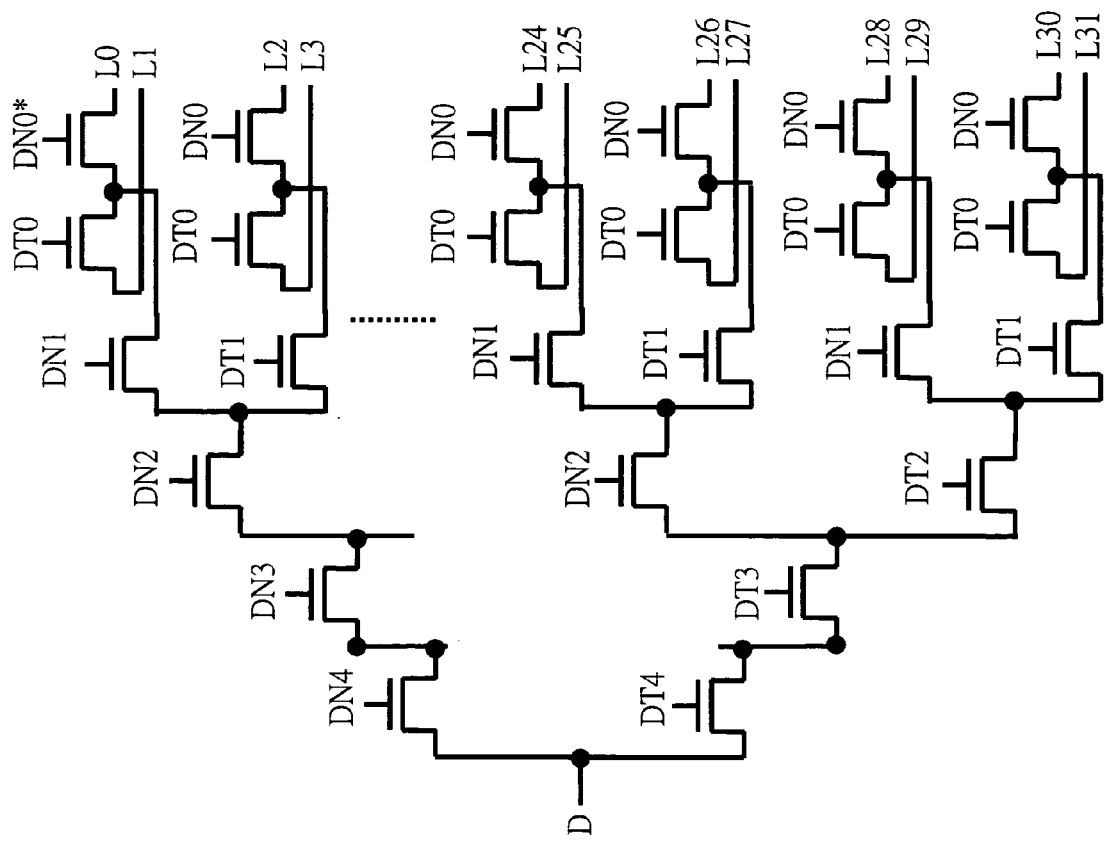
FIG. 5 is a circuit diagram of a logic 211 unit of a first decoder unit according to a preferred embodiment of the invention.
Figure 6:
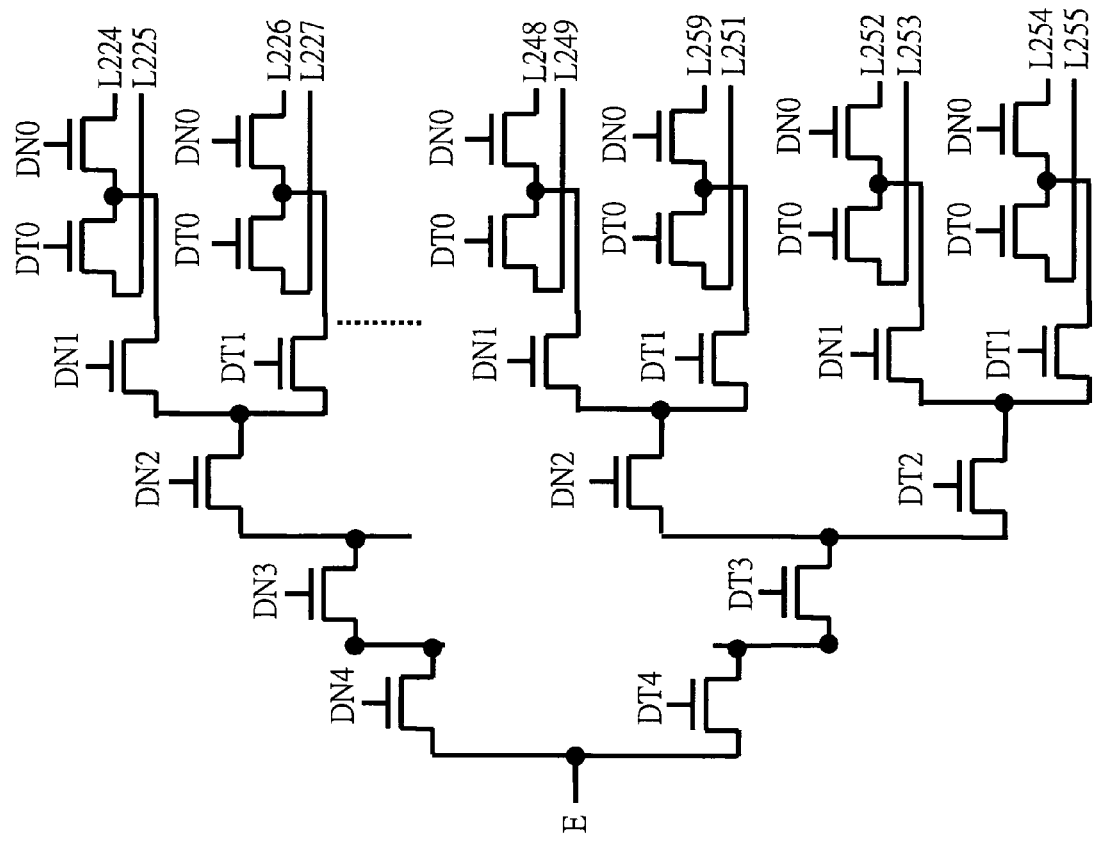
FIG. 6 is a circuit diagram of a logic 212 unit of a first decoder unit according to a preferred embodiment of the invention.
Figure 7:
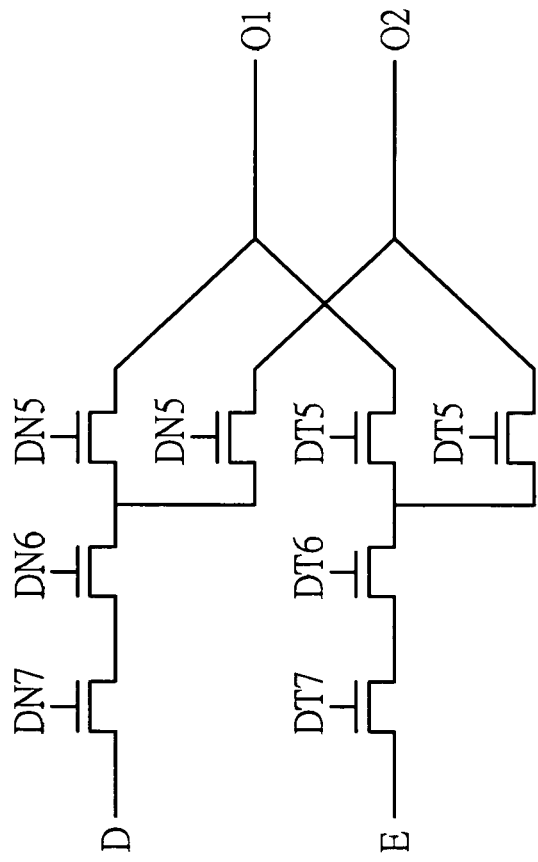
FIG. 7 is a circuit diagram of a logic 213 unit of a first decoder unit according to a preferred embodiment of the invention.

Referring to FIG. 4~FIG. 7. FIG. 4 is a logic operation reference table of a decoder apparatus 21 of FIG. 1. FIG. 5 is a circuit diagram of a logic 211 unit of a first decoder unit according to a preferred embodiment of the invention. FIG. 6 is a circuit diagram of a logic 212 unit of a first decoder unit according to a preferred embodiment of the invention. FIG. 7 is a circuit diagram of a logic 213 unit of a first decoder unit according to a preferred embodiment of the invention.

The first decoder unit comprises logic units 211, 212 and 213, wherein the logic unit 211 and 212 respectively receives and selects the voltages L0~L31 as the voltage D and receives and selects the voltages L224~L255 as the voltage E in response to the bit data DT0~DT4 and DN0~DN4. For example, when the gray level GS is equal to 31, the pixel data DT4~DT0 are all equal to 1. Therefore, the transistors, which are controlled by the pixel data DT4~DT0, in the logic unit 211 are turned on and the voltage L31 is selected and outputted as the voltage D. In another example, when the gray level GS is equal to 255, the pixel data DT4~DT0 are all equal to 1. Therefore, the transistors, which are controlled by the pixnet data DT4~DT0, in the logic unit 212 are turned on and the voltage L255 is selected and outputted as the voltage E.

The logic unit 213 receives and selects one of the voltage D or E as the voltages O1 and O2 in response to bit data DT5~DT7 and DN5~DN7, wherein the logic operation is indicated in FIG. 4. For example, when the gray level GS is equal to 31, the bit data DT7~DT0 are all 0 and DN7~DN5 are all 1. Therefore, the logic unit 213 selects and outputs the voltage D as the voltage O1 and O2. In another example, when the gray level GS is equal to 255, the bit data DT7~DT0 are all 1 and the DN7~DN5 are all 0. Therefore, the logic unit 213 selects and outputs the voltage E as the voltage O1 and O2. Although only the operations when the gray level GS is equal to 31 and 255 are cited as example in the present embodiment of the invention, the operations when the gray level GS is equal to other values can be obtained analogically. Thus, when the gray level GS is equal to one of the values 0~31 and 224~255, the first decoder unit effectively provides the one of the corresponding voltages L0~L31 and L244~L255 as the voltage O1 and O2.

Figure 8:
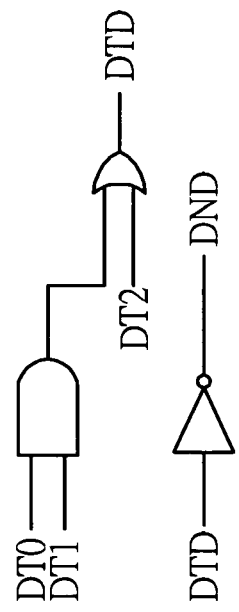
FIG. 8 is a circuit diagram of a logic 214 unit of a second decoder unit according to a preferred embodiment of the invention.
Figure 9:
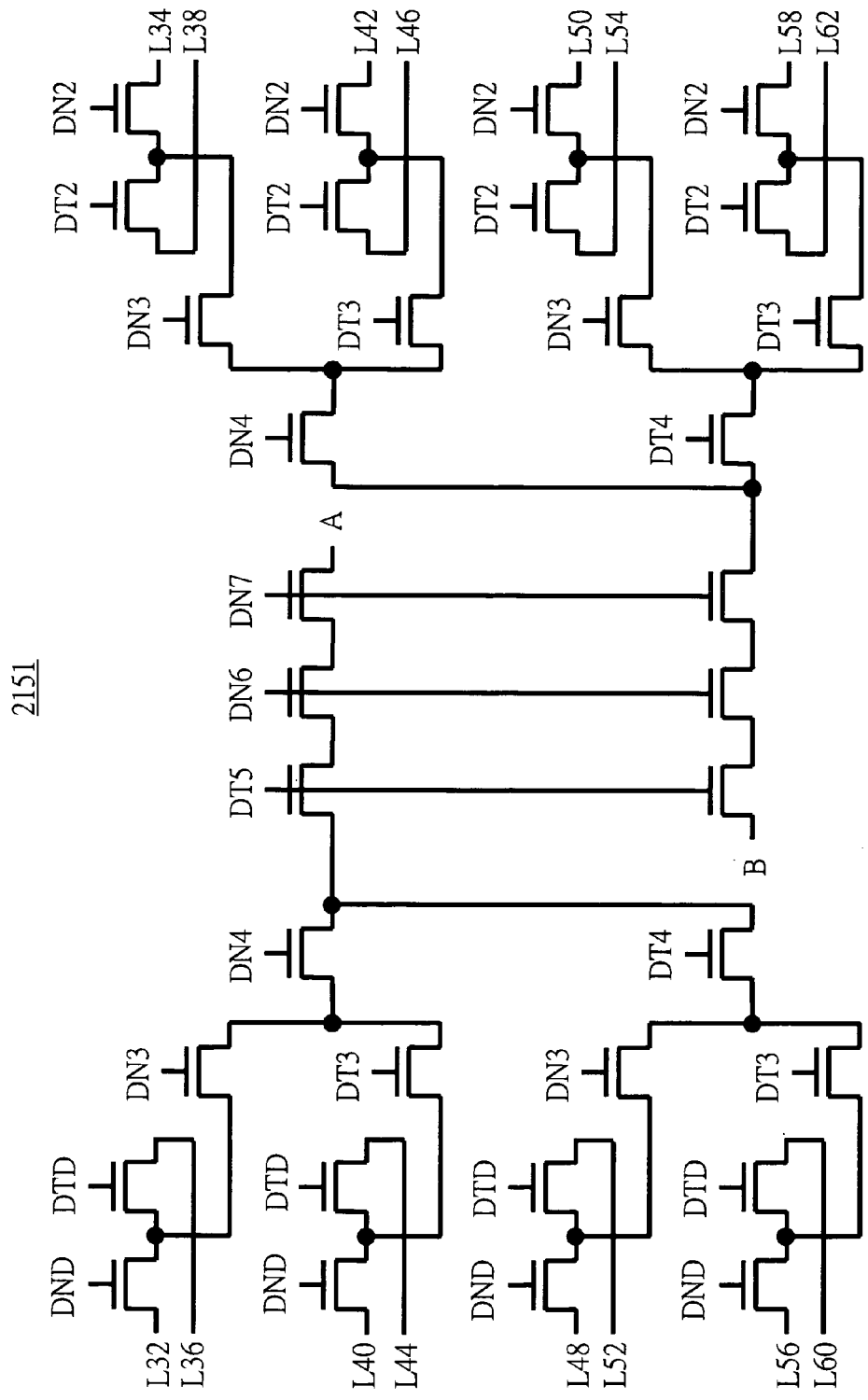
FIG. 9 is a circuit diagram of a logic 2151 unit of a second decoder unit according to a preferred embodiment of the invention.
Figure 10:
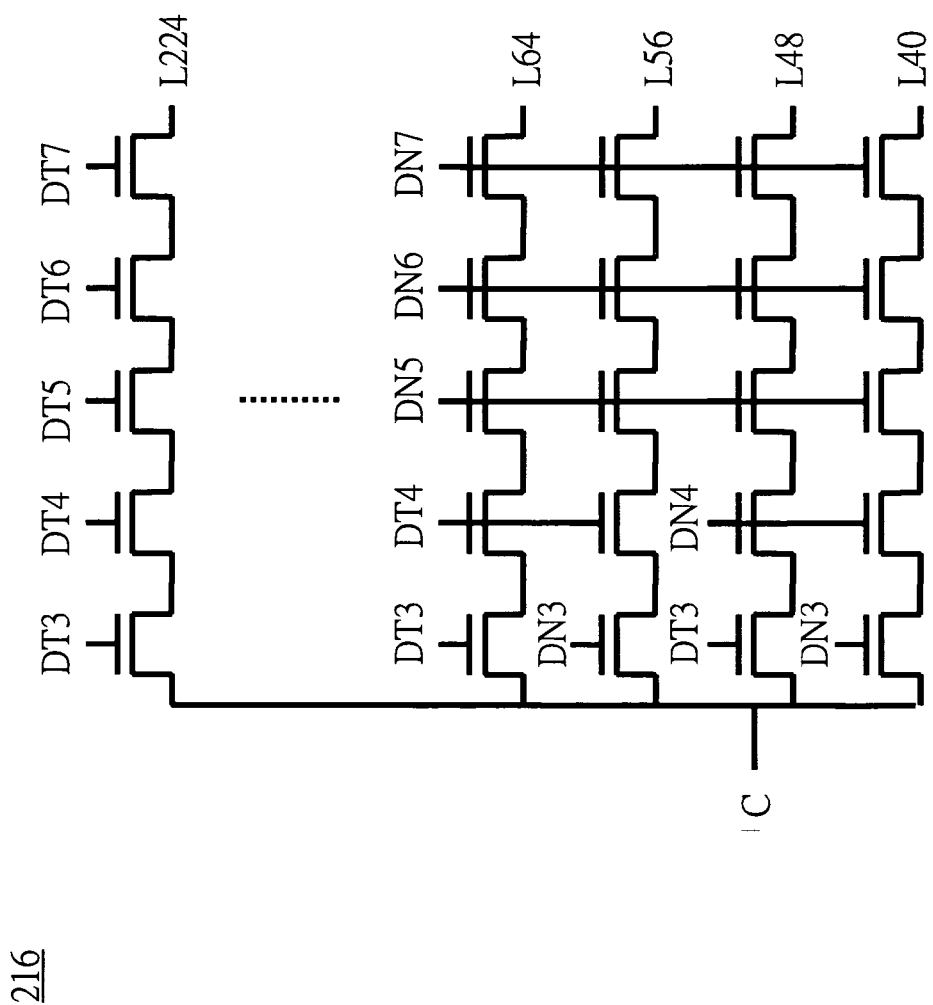
FIG. 10 is a circuit diagram of a logic 216 unit of a second decoder unit according to a preferred embodiment of the invention.
Figure 11:
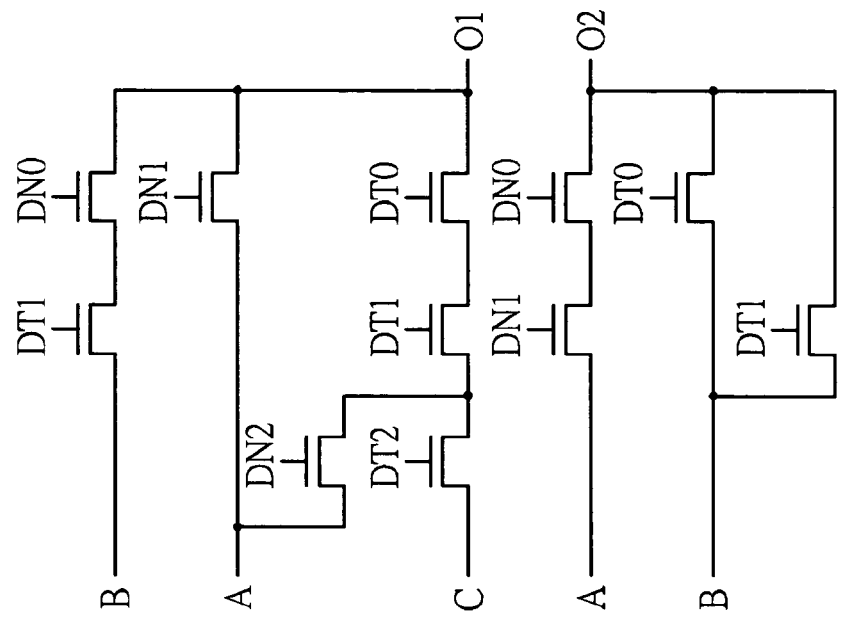
FIG. 11 is a circuit diagram of a logic 217 unit of a second decoder unit according to a preferred embodiment of the invention.

Referring to FIG. 8~FIG. 11. FIG. 8 is a circuit diagram of a logic 214 unit of a second decoder unit according to a preferred embodiment of the invention. FIG. 9 is a circuit diagram of a logic 2151 unit of a second decoder unit according to a preferred embodiment of the invention. FIG. 10 is a circuit diagram of a logic 216 unit of a second decoder unit according to a preferred embodiment of the invention. FIG. 11 is a circuit diagram of a logic 217 unit of a second decoder unit according to a preferred embodiment of the invention. The second decoder unit comprises the logic units 214, 215n, 216 and 217, n is a natural number.

Each logic unit 215n receives 15 sets of border voltages and respectively selects two border voltages as the voltage A and voltage B in response to the bit data DT2~DT7, DN2~DN7, the control signal DTD and DND, and the logic operation is indicated in FIG. 4. As illustrated in FIG. 9, the logic unit 2151 receives border voltages L32 and L34, L34 and L36, L36 and L38, . . . , and L60 and L62. When the gray level GS is equal to 33, the bit data DT2~DT7 are respectively equal to 0, 0, 0, 1, 0 and 0, the bit data DN2~DN7 are respectively equal to 1, 1, 1, 0, 1 and 1, and the control signals DTD and DND are respectively equal to 0 and 1. Meanwhile, the logic unit 2151 provides the border voltages L32 and L34 as the voltage A and B respectively.

Although only the operation of the logic unit 2151 is cited as an example in the present embodiment of the invention, the operations of other logic units 215n are similar to the operation of the logic unit 2151 and can be obtained analogically.

The logic unit 214 generates a control signal DTD by performing logic operation DTD=DT2+DT1*DT0 according to the bit data DT0~DT2, and generates a control signal DND according to the control signal DTD, wherein the control signal DND and the control signal DTD are inverse to each other. The logic unit 216 selects one of the border voltages L40, L48, L56, . . . , and L224 as the voltage C in response to the bit data DT3~DT7 and DN3~DN7.

The logic unit 217 selects one of the voltages A, B and C as the voltage O1 and selects one of the voltages A and B as the voltage O2 respectively in response to the bit data DT0~DT2 and DN0~DN2. When the gray level GS is equal to an even number between 32~224, the voltage O1 and O2 selected by the logic unit 217 are substantially the same. For example, when the gray level GS is equal to 32, 36, 40, . . . , 212, 216, and 220, both the voltages O1 and O2 are equal to the voltage A; when the gray level GS is equal to 34, 38, 42, 46, . . . 214, 218, and 222, both the voltages O1 and O2 are equal to the voltage B. When the gray level GS is equal to odd numbers between 31~223, different voltages are selected as the voltages O1 and O2. When the gray level GS is equal to 33, 35, 37, 41, 43, 45, 49, 51, 53, . . . , 209, 211, 213, 217, 219, and 221, the logic unit 217 selects voltages A and B as the voltages O1 and O2 respectively. Afterwards, the operational amplifier 22 obtains the pixel voltage PV corresponding to the gray level GS by way of interpolation of the voltages O1 and O2.

When the gray level GS is equal to odd numbers 39, 47, 55, 63, . . . , 207, 215, and 223, the logic unit 217 selects voltages C and B as the voltages O1 and O2 respectively. For example, when the gray level GS is equal to 39, the logic units 2151 selects the border voltage L36 and L38 as the voltage A and B and the logic units 216 selects the border voltage L40 as the voltage C. Therefore, the logic unit 217 respectively selects the voltages C and B as the voltages O1 and O2 and the operational amplifier 22 generates the pixel voltage PV corresponding to the gray level GS 39 according to the border voltage L38 and L40. When the gray level GS is equal to 47, 55, 63, . . . , and 223, the logic unit 2152~215n, 216, and 217 operates similarly to select the corresponding voltages C and B as the voltage O1 and O2.

In the present embodiment of the invention, the gray level GS comprises 8-bit. However, the D/A converter of the present embodiment of the invention can perform D/A conversion to the gray level having more than or less than 8-bits in addition to the gray level having 8-bits. The number grouping method for the first value set and the second value set of the gray level GS of the present embodiment of the invention is not limited to the grouping method disclosed in the present embodiment of the invention and can be done according to other methods.

The D/A converter of the present embodiment of the invention flexibly divides the values of the gray level into sets by a logic unit capable of performing particular logic operations, and obtains pixel voltages corresponding to different value sets of the gray level by operational methods which are substantially different. The D/A converter of the present embodiment of the invention effectively resolves the shortcomings of conventional technologies including larger circuit area and higher cost and achieving the advantages of smaller area and lower cost. Besides, the D/A converter of the present embodiment of the invention effectively larger error in pixel voltage caused by interpolation of digital code when the corresponding Gamma curve is too non-linear. Furthermore, the liquid crystal display using the technology of the invention substantially has the advantages of lower error in pixel voltage and better display quality.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A digital-to-analog (D/A) converter, for generating a pixel voltage, selectively corresponding to a plurality of levels, in response to a plurality of respective values of a gray level, the D/A converter comprising:

an operational amplifier, generating the pixel voltage by means of interpolating a first voltage and a second voltage, so as to obtain the pixel voltage ranged between the first and the second voltage; and a decoder, having values of the gray level segmented into a first value set, corresponding to a substantially non-linear segment of a Gamma curve, and at least a second value set, corresponding to a substantially linear segment of the gamma curve, the decoder comprising:

a first decode unit, for setting the first voltage and the second voltage to be a same voltage within a first voltage set in responding to a value within the first value set of the gray level, so that the pixel voltage corresponding to the first value set of the gray level is obtained without said generating by means of interpolating of the operational amplifier; and a second decode unit, for generating a control signal when a least significant bit and a second least significant bit of the gray level are both logical 1 or a third least significant bit of the gray level is logical 1, the second decode unit further for setting the first and the second voltages to be a same first border voltage in response to a maximum value of the at least a second value set of the gray level and the control signal, for setting the first and the second voltages to be a second border voltage in response to a same minimum value of the at least a second value set of the gray level and the control signal, so that the pixel voltage corresponding to the maximum and the minimum values of the at least a second value set of the gray level are obtained without said generating by means of interpolating of the operational amplifier, wherein the second decode unit is further for respectively setting the first and the second voltages to be the first and the second border voltages in response to an intermediate value of the at least a second value set of the gray level and the control signal, so that the pixel voltage corresponding to the intermediate value of the at least a second value set of the gray level is obtained by said generating by means of interpolating of the operational amplifier.

2. The D/A converter according to claim 1, wherein m minimum values of the gray level are comprised in the first value set, the m minimum values respectively correspond to m lowest voltages of the first voltage set, and m is a natural number greater than 1.

3. The D/A converter according to claim 2, wherein the gray level has k bits, k is a natural number, and the first decoder unit comprises:
  a first logic unit which provides m lowest voltages as the first and the second voltages when i most significant bits of the gray level are all logical 0, and i is a natural number smaller than k and related to m.

4. The D/A converter according to claim 1, wherein m maximum values of the gray level are comprised in the first value set, the m maximum values respectively correspond to m highest voltages of the first voltage set, and m is a natural number greater than 1.

5. The D/A converter according to claim 4, wherein the gray level has k bits, k is a natural number, and the first decoder unit comprises:
  a second logic unit, which provides the m highest voltages as the first and the second voltages when i most significant bits of the gray level are all logical 1, wherein i is a natural number smaller than k and related to m.

6. The D/A converter according to claim 1, wherein m maximum values and m minimum values of the gray level are comprised in the first value set, the m maximum and the m minimum values respectively correspond to m highest voltages and m lowest voltages of the first voltage set, and m is a natural number greater than 1.

7. The D/A converter according to claim 6, wherein the gray level has k bits, k is a natural number, and the first decoder unit comprises:
  a first logic unit, for providing the m lowest voltages as the first and the second voltages when i most significant bits of the gray level are all logical 0, wherein i is a natural number smaller than k and related to m; and
  a second logic unit, for providing the m highest voltages as the first and the second voltages when the i most significant bits of the gray level are all logical 1.

8. The D/A converter according to claim 1, wherein the second decoder unit comprises:
  a fourth logic unit, for providing one of the first and the second border voltages as a first intermediate voltage in response to j most significant bits of the gray level and the control signal, wherein j is a natural number smaller than (k−1);
  a fifth logic unit, for providing the other one of the first and the second border voltages as a second intermediate voltage in response to the (j+1) most significant bits of the gray level; and
  a sixth logic unit, for selecting a third intermediate voltage in response to the j most significant bits of the gray level.

9. The D/A converter according to claim 8, wherein the second decoder unit further comprises:
  a seventh logic unit, for providing the second intermediate voltage as the first voltage when the first bit and the second bit are respectively logical 0 and logical 1, for providing the first intermediate voltage as the first voltage when the second bit is logical 0 or when the first to the third bits are respectively logical 1, logical 1, and logical 0, and for providing the third intermediate voltage as the first voltage when the first to the third bits are all logical 1; and
  an eighth logic unit, for providing the first intermediate voltage as the second voltage when the first bit and the second bit are both logical 0 and for providing the second intermediate voltage as the second voltage when the first bit or the second bit is logical 1.

10. The D/A converter according to claim 1, wherein the operational amplifier has two positive input ends for receiving the first voltage and the second voltage respectively, and the operational amplifier obtains the pixel voltage by performing interpolation according to the first and the second voltage.

* * * * *